United States Patent
Tsuji et al.

(10) Patent No.: US 10,043,821 B2
(45) Date of Patent: Aug. 7, 2018

(54) NON-VOLATILE MEMORY DEVICE AND METHOD OF MANUFACTURING SAME

(71) Applicant: Toshiba Memory Corporation, Minato-ku (JP)

(72) Inventors: Masaki Tsuji, Yokkaichi (JP); Yoshiaki Fukuzumi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/679,301

(22) Filed: Aug. 17, 2017

(65) Prior Publication Data

US 2018/0026048 A1 Jan. 25, 2018

Related U.S. Application Data

(63) Continuation of application No. 14/643,056, filed on Mar. 10, 2015, now Pat. No. 9,773,803.

(Continued)

(51) Int. Cl.
*H01L 27/115* (2017.01)
*H01L 27/11582* (2017.01)
(Continued)

(52) U.S. Cl.
CPC .. *H01L 27/11582* (2013.01); *H01L 27/11556* (2013.01); *H01L 27/11565* (2013.01); *H01L 27/11578* (2013.01); *H01L 27/11597* (2013.01); *H01L 29/66666* (2013.01); *H01L 29/66833* (2013.01); *H01L 29/7926* (2013.01)

(58) Field of Classification Search
CPC ......... H01L 27/11578; H01L 27/11582; H01L 29/7926; H01L 27/11556; H01L 27/11597
See application file for complete search history.

(56) References Cited

U.S. PATENT DOCUMENTS

| 8,427,881 B2 | 4/2013 | Jang et al. | |
|---|---|---|---|
| 2010/0072538 A1* | 3/2010 | Kito | H01L 27/11578 257/326 |

(Continued)

FOREIGN PATENT DOCUMENTS

JP 2011-192879 9/2011

*Primary Examiner* — Ermias Woldegeorgis
(74) *Attorney, Agent, or Firm* — Oblon, McClelland, Maier & Neustadt, L.L.P.

(57) ABSTRACT

According to an embodiment, a non-volatile memory device includes a first conductive layer, electrodes, an interconnection layer and at least one semiconductor layer. The electrodes are arranged between the first conductive layer and the interconnection layer in a first direction perpendicular to the first conductive layer. The interconnection layer includes a first interconnection and a second interconnection. The semiconductor layer extends through the electrodes in the first direction, and is electrically connected to the first conductive layer and the first interconnection. The device further includes a memory film between each of the electrodes and the semiconductor layer, and a conductive body extending in the first direction. The conductive body electrically connects the first conductive layer and the second interconnection, and includes a first portion and a second portion connected to the second interconnection. The second portion has a width wider than the first portion.

20 Claims, 21 Drawing Sheets

Related U.S. Application Data

(60) Provisional application No. 62/047,350, filed on Sep. 8, 2014.

(51) Int. Cl.
*H01L 27/11556* (2017.01)
*H01L 27/11565* (2017.01)
*H01L 29/66* (2006.01)
*H01L 29/792* (2006.01)
*H01L 27/11578* (2017.01)
*H01L 27/11597* (2017.01)

(56) References Cited

U.S. PATENT DOCUMENTS

| | | | |
|---|---|---|---|
| 2013/0032874 A1* | 2/2013 | Ko | H01L 29/7926 257/324 |
| 2014/0014889 A1 | 1/2014 | Shim et al. | |
| 2015/0221667 A1 | 8/2015 | Fukuzumi et al. | |
| 2015/0263035 A1 | 9/2015 | Tsuji et al. | |

* cited by examiner

NON-VOLATILE MEMORY DEVICE AND METHOD OF MANUFACTURING SAME

CROSS-REFERENCE TO RELATED APPLICATIONS

This application is a continuation of and claims the benefit of priority under 35 U.S.C. § 120 from U.S. application Ser. No. 14/643,056 filed Mar. 10, 2015 and claims the benefit of priority from U.S. Provisional Patent Application 62/047,350 filed Sep. 8, 2014; the entire contents of each of which are incorporated herein by reference.

FIELD

Embodiments are generally related to a non-volatile memory device and a method of manufacturing the same.

BACKGROUND

A NAND type non-volatile memory device has been developed, which includes a memory cell array of a three-dimensional structure. The memory cell array includes, for example, word lines stacked on a source layer, a channel body extending through the word lines, and a memory cell provided between each word line and the channel body. Moreover, for example, an interconnection layer including a source line and a bit line is provided on a side of the word lines opposite to a source layer. Then, the channel body is electrically connected to the source layer and the bit line. In addition, the source layer is electrically connected to the source line by a conductive body provided through the word lines. Thus, a NAND string that includes memory cells is provided along the channel body.

In a manufacturing process of the memory cell array, a memory film and a channel body are formed in a memory hole that extends through the word lines to the source layer. The memory film includes a charge storage portion between the word line and the cannel body, which serves as the memory cell. The memory film is also an insulation film which electrically insulates the word line and the channel body, and thus, a process of selectively removing the memory film at the bottom of the memory hole is necessary to electrically connect the channel body and the source layer. In some cases, the channel body and the source layer are formed together, and the source layer that is formed under the word lines is covered with the memory film. In such a case, a process of selectively removing the memory film is also required to electrically connect the source layer and the source interconnection via the conductive body. Such a process may become more difficult as the miniaturization of the memory cell array progresses. That is, a process margin for selectively removing the memory film becomes smaller, and the small margin may generate unintentional over-etching in other portions. Hence, a non-volatile memory device and a manufacturing method thereof are required, which provides a large process margin for selectively removing the memory film.

DETAILED DESCRIPTION

Figure 1:
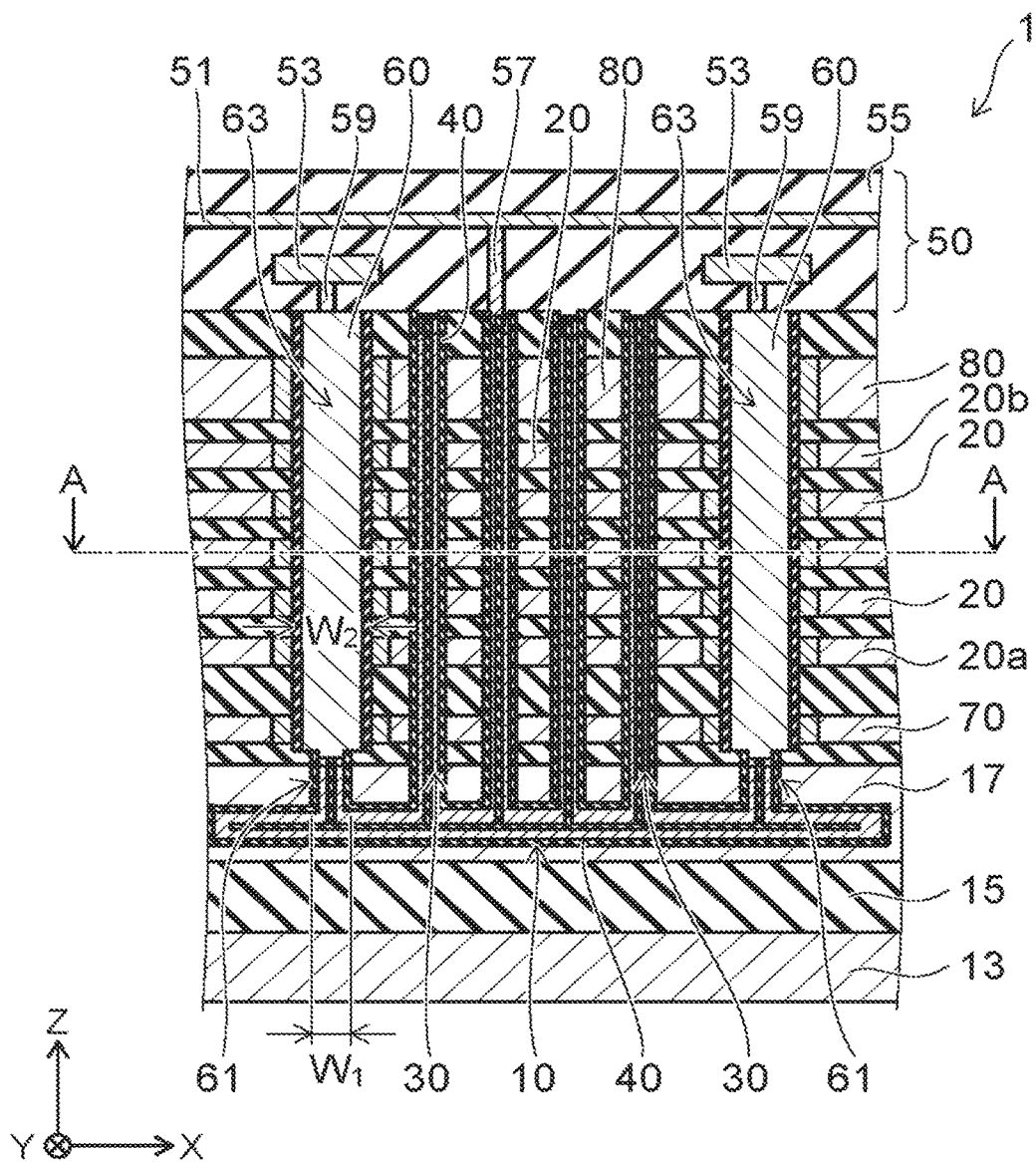
FIG. 1 is a schematic cross-sectional view showing a non-volatile memory device according to a first embodiment.

According to an embodiment, a non-volatile memory device includes a first conductive layer, electrodes, an interconnection layer and at least one semiconductor layer. The electrodes are arranged in a first direction perpendicular to the first conductive layer. The interconnection layer is provided on a side of the electrodes opposite to the first conductive layer, and the interconnection layer includes a first interconnection and a second interconnection. The semiconductor layer extends through the electrodes in the first direction. One end of the semiconductor layer is electrically connected to the first conductive layer, and the other end of the semiconductor layer is electrically connected to the first interconnection layer. The device further includes a memory film provided between each of the electrodes and the semiconductor layer, and a conductive body extending in the first direction between the first conductive layer and the second interconnection. The conductive body electrically connects the first conductive layer and the second interconnection, and includes a first portion and a second portion. The first portion is connected to the first conductive layer, and the second portion is electrically connected to the second interconnection and has a width wider than the first portion in a second direction orthogonal to the first direction.

Hereinafter, embodiments will be described with reference to drawings. The same numeral is applied to the same portion in the drawings to appropriately omit a detailed description thereof, and a different portion will be described. The drawings are schematic or conceptual, such that a relationship between a thickness and a width of each portion, and a size ratio between portions are not necessarily the same as real ones. Moreover, when representing the same portion, dimensions and ratios are represented differently from each other by the drawings.

Moreover, an arrangement and a configuration of each portion will be described by using an X axis, a Y axis, and a Z axis shown in each drawing. The X axis, the Y axis, and the Z axis are orthogonal to one another and represent an X-direction, a Y-direction, and a Z-direction, respectively. In addition, the Z-direction is described as upward and a direction opposite to the Z-direction is described as downward in some cases.

First Embodiment

FIG. 1 is a schematic cross-sectional view which shows a non-volatile memory device 1 according to a first embodiment.

Figure 2:
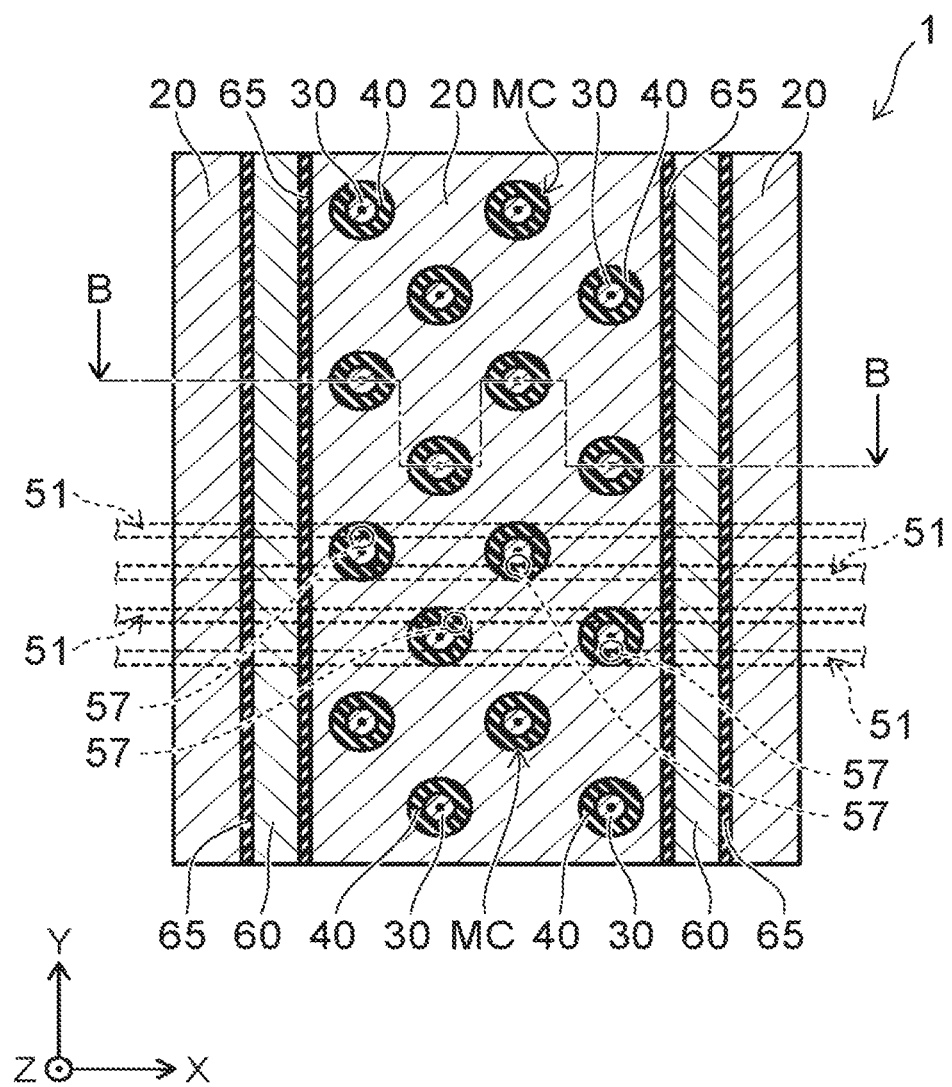
FIG. 2 is a schematic view showing another cross section of the non-volatile memory device according to the first embodiment.

FIG. 2 is a schematic view which shows another cross-section of the non-volatile memory device according to the first embodiment. FIG. 2 shows a structure of a cross-section taken along line A-A shown in FIG. 1.

A non-volatile memory device 1 includes a first conductive layer (hereinafter, source layer 10), electrodes, at least one semiconductor layer (hereinafter, channel body 30), and a memory film 40. The electrodes include, for example, control gates 20, a selection gate 70, and a selection gate 80.

The electrodes are arranged in a first direction (hereinafter, Z-direction) which is perpendicular to the source layer 10. In addition, the electrodes extend in the Y-direction, respectively. The channel body 30 extends through the electrodes in the Z-direction. The memory film 40 is provided between each of the electrodes and the channel body 30. A memory cell MC is provided between each control gate 20 and the channel body 30.

The non-volatile memory device 1 further includes an interconnection layer 50. The interconnection layer 50 is provided on a side of the electrodes opposite to the source layer 10. The interconnection layer 50 includes first interconnections (hereinafter, bit lines 51), a second interconnection (hereinafter, source line 53), and an interlayer insulation film 55. The bit lines 51 extend in, for example, the X-direction, and are disposed in parallel in the Y-direction.

One end of the channel body 30 is electrically connected to the source layer 10, and the other end thereof is electrically connected to a bit line 51. In this example, a lower end of the channel body 30 is directly connected to the source layer 10. In other words, the channel body 30 and the source layer 10 are formed together, and the channel body 30 extends from the source layer 10 in the Z-direction.

An upper end of the channel body 30 is electrically connected to any one of the bit lines 51. For example, the upper end of the channel body 30 is electrically connected to the bit line 51 through a contact plug 57.

The selection gate 70 is provided between the source layer 10 and a control gate 20a. The control gate 20a is positioned at an end of the control gates 20 on the source layer 10 side.

The selection gate 80 is provided between a control gate 20b and the interconnection layer 50. The control gate 20b is positioned at an end of the control gates 20 on the interconnection layer 50 side.

The selection gates 70 and 80 act as a gate electrode which switches ON/OFF states of a selection transistor, and thus controls electrical conduction of the channel body 30, respectively.

Furthermore, the non-volatile memory device 1 includes a conductive body 60. The conductive body 60 extends between the source layer 10 and the source line 53 in the Z-direction, and electrically connects the source layer 10 and the source line 53.

The conductive body 60 has a first portion 61 and a second portion 63. The first portion 61 is connected to the source layer 10. In other words, the first portion 61 is formed together with the source layer 10, and extends from the source layer 10 in the Z-direction. The first portion 61 is provided to have a length shorter than an interval between the source layer 10 and the selection gate 70 in the Z-direction.

The second portion 63 is electrically connected to the source line 53. For example, the second portion 63 is electrically connected to the source line 53 through a contact plug 59. In addition, a width $W_2$ of the second portion 63 in the X-direction is wider than a width $W_1$ of the first portion 61 in the X-direction.

Specifically, the non-volatile memory device 1 includes a substrate 13, an interlayer insulation film 15, and a second conductive layer (hereinafter, back gate layer 17). The substrate 13 is, for example, a silicon substrate.

The source layer 10 is embedded in the back gate layer 17. For example, the memory film 40 is interposed between the source layer 10 and the back gate layer 17, and electrically insulates each other. The memory film 40 is also interposed between the first portion 61 and the back gate layer 17, and electrically insulates each other.

As shown in FIG. 1, a boundary between the first portion 61 and the second portion 63 is positioned at a level between the back gate layer 17 and the selection gate 70 in the Z-direction. Here, "level" means a position in the Z-direction, and indicates, for example, a height from an upper surface of the source layer 10.

As shown in FIG. 2, the control gate 20 has, for example, a rectangular shape extending in the Y-direction. The control gate 20 is disposed in parallel in the X-direction. The conductive body 60 is provided between adjacent control gates 20 in the X-direction. An insulation film 65 is provided between the control gate 20 and the conductive body 60, and electrically insulates each other.

The non-volatile memory device 1 includes channel bodies 30 extending through the control gates 20 in the Z-direction. The channel body 30 has a cross section of a circular shape perpendicular to the Z-direction, for example. The memory film 40 is provided between the control gate 20 and the channel body 30. Then, a memory cell MC is provided between the control gate 20 and the channel body 30.

Moreover, the channel body 30 is disposed at a connectable position through the contact plug 57 in any one of the bit lines 51 disposed in parallel in the Y-direction. For example, FIG. 1 is a cross-section taken along line B-B shown in FIG. 2.

Then, a method of manufacturing the non-volatile memory device 1 according to the first embodiment will be described referring to FIGS. 3A to 11. FIGS. 3A to 11 are schematic cross-sectional views each showing a manufacturing step of the non-volatile memory device 1.

Figure 3A:
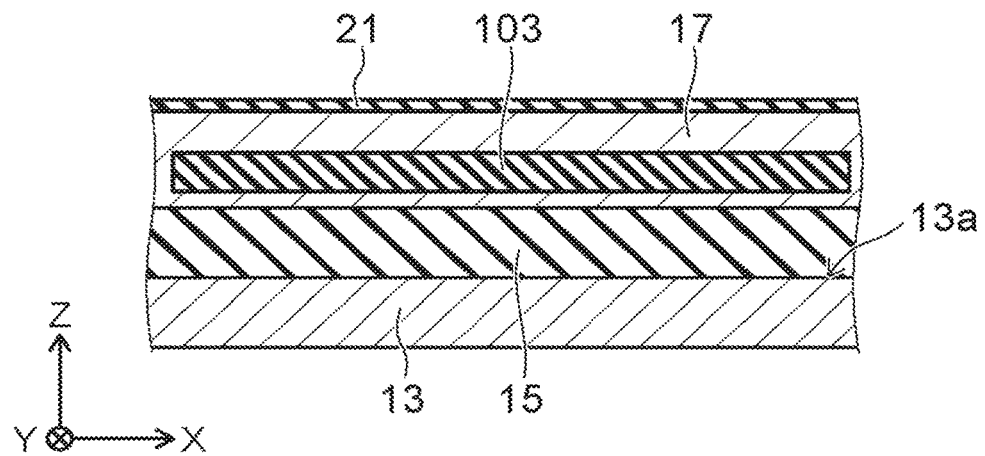
FIGS. 3A to 11 are schematic cross-sectional views showing a manufacturing process of the non-volatile memory device according to the first embodiment.

As shown in FIG. 3A, a wafer is prepared in which the interlayer insulation film 15, the back gate layer 17, and an insulation film 21 are sequentially formed on the substrate 13. The substrate 13 is, for example, a silicon substrate. For example, an integrated circuit may be formed on an upper surface 13a of the substrate 13 to control a memory cell array.

The back gate layer 17 is, for example, a polycrystalline silicon (poly-silicon) layer doped with P-type impurities. A sacrificial layer 103 is embedded in the back gate layer 17. The sacrificial layer 103 is, for example, a non-doped poly-silicon layer, which is not intentionally doped with impurities. The sacrificial layer 103 has, for example, a rectangular parallelepiped shape, extending through the back gate layer 17 in the Y-direction. The insulation film 21 provided on the back gate layer 17 is, for example, a silicon oxide film.

Figure 3B:
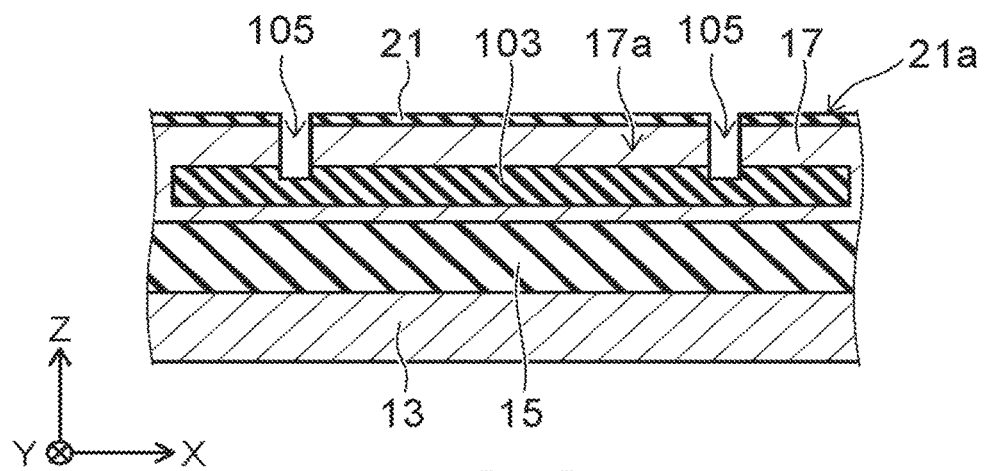

As shown in FIG. 3B, a slit 105 is formed to have a depth of reaching the sacrificial layer 103 from an upper surface 21a of the insulation film 21. The slit 105 is a groove extending in the Y-direction. The slit 105 is formed by using, for example, a reactive ion etching (RIE) and by selectively etching the insulation film 21 and an upper portion 17a of the back gate layer 17.

Figure 3C:
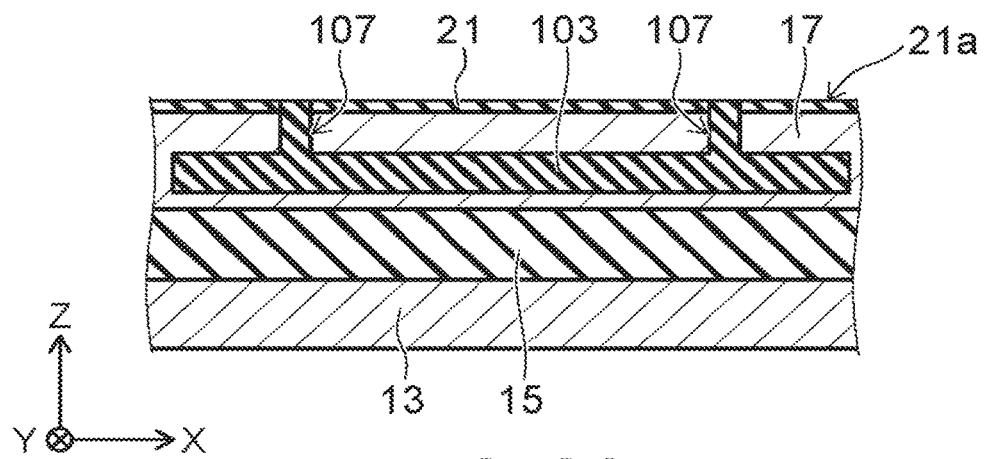

As shown in FIG. 3C, a sacrificial layer 107 is formed in the slit 105. The sacrificial layer 107 is, for example, made of the same material as the sacrificial layer 103. Specifically, the non-doped poly-silicon layer is formed on a wafer having the slit 105, and embeds the slit 105. Then, the poly-silicon layer on the wafer is etched until the upper surface 21a of the insulation film 21 is exposed, thus leaving a portion of the poly-silicon layer embedded in the slit 105.

Figure 4:
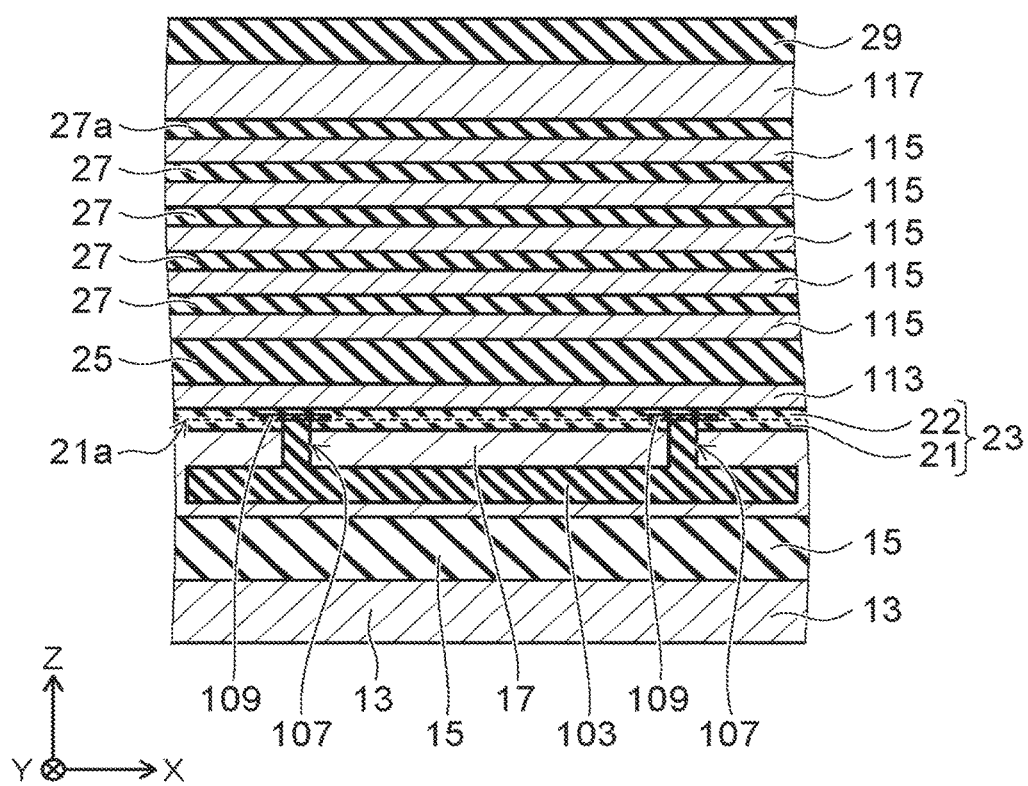

As shown in FIG. 4, a protective film 109 is selectively formed, and covers the exposed portion of the sacrificial layer 107 in the upper surface 21a of the insulation film 21.

The protective film 109 is, for example, a tantalum oxide film or an amorphous silicon film. Then, an insulation film 22 is formed on the insulation film 21 and the protective film 109. The insulation film 22 is, for example, a silicon oxide film. As a result, an insulation film 23 is formed as a first layer on the back gate layer 17. The insulation film 23 includes the insulation film 21 and the insulation film 22.

Then, a conductive film 113 and an insulation film 25 are sequentially formed on the insulation film 23. The conductive film 113 is, for example, a conductive poly-silicon film. The insulation film 25 is, for example, a silicon oxide film.

Subsequently, a conductive film 115 and an insulation film 27 are alternately stacked on the insulation film 25. The conductive film 115 is, for example, a conductive poly-silicon film. The insulation film 27 is, for example, a silicon oxide film. The number of stacked layers of the conductive film 115 is the same as the number of memory cells MC disposed in the Z-direction along the channel body 30.

Further, a conductive film 117 and an insulation film 29 are sequentially formed on an insulation film 27a. The insulation film 27a is positioned at an upper end of the insulation films 27 stacked in the Z-direction. The conductive film 117 is, for example, a conductive poly-silicon film. The insulation film 29 is, for example, a silicon oxide film.

Figure 5:
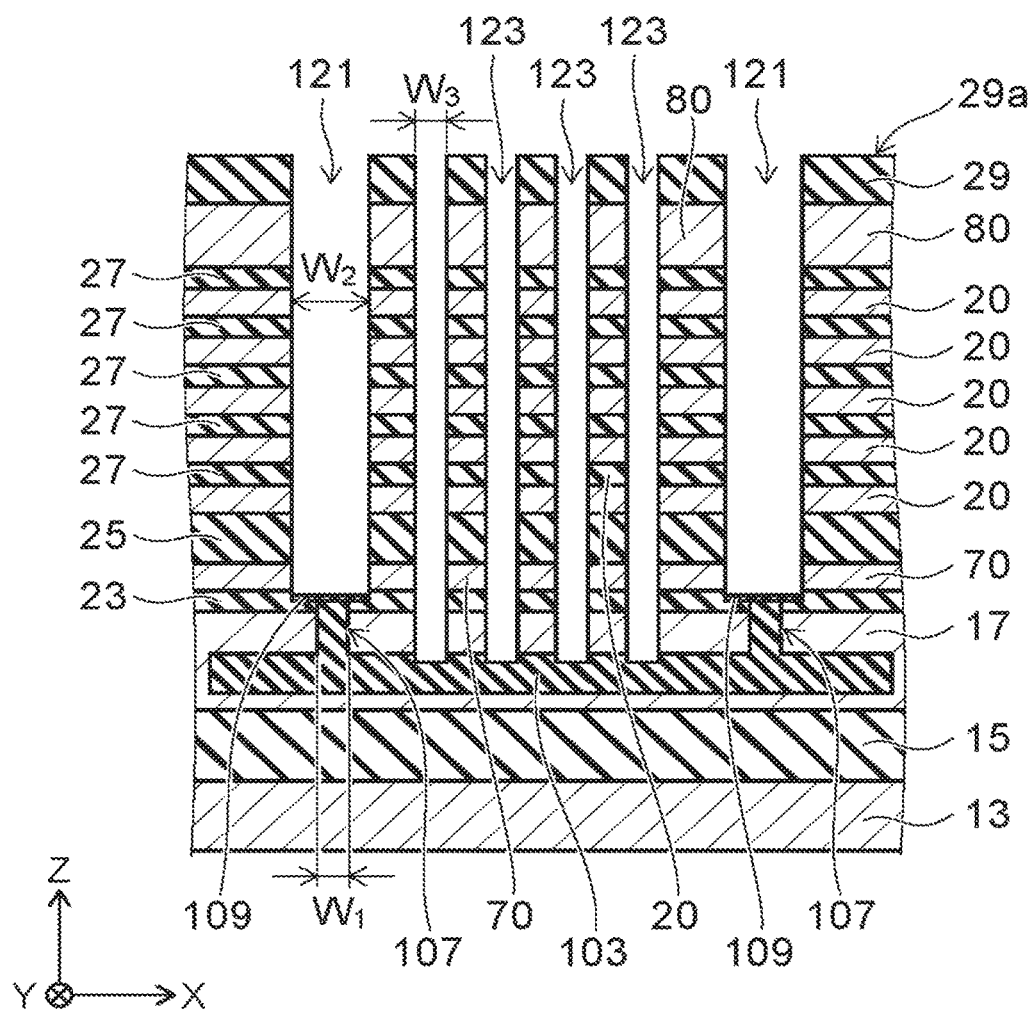

As shown in FIG. 5, a slit 121 and a memory hole 123 are formed through the stacked structure. The slit 121 and the memory hole 123 are formed by using, for example, RIE. The slit 121 is a groove that has a depth of reaching the protective film 109 from an upper surface 29a of the insulation film 29, and extends in the Y-direction. The slit 121 divides the conductive film 113, the conductive film 115, and the conductive film 117 into the selection gate 70, the control gate 20, and the selection gate 80, respectively.

The memory hole 123 has, for example, a circular opening, and has a depth of reaching the sacrificial layer 103 from the upper surface 29a of the insulation film 29. The memory hole 123 may extend through the sacrificial layer 103. In addition, an opening diameter $W_3$ of the memory hole 123 is smaller than a width $W_2$ of the slit 121 in the X-direction. The opening diameter $W_3$ of the memory hole 123 is the same as, for example, a width $W_1$ of the sacrificial layer 107 in the X-direction, for example.

The memory hole 123 and the slit 121 are preferably formed at the same time. For example, the protective film 109 exposed at a bottom surface of the slit 121 serves as an etching stop film. That is, the slit 121 is not etched deeper than a position of the protective film 109, while the memory hole 123 is etched to a depth of reaching the sacrificial layer 103.

Figure 6:
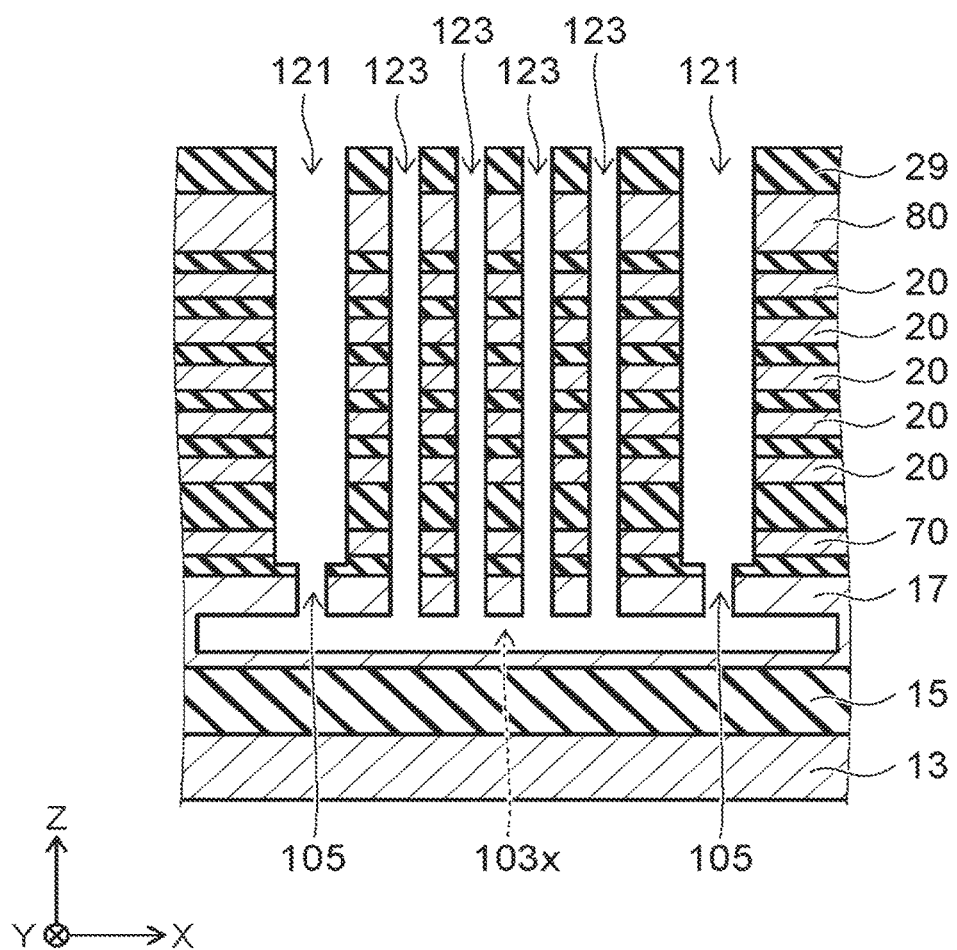

Then, the protective film 109 is selectively removed via the slit 121. Subsequently, as shown in FIG. 6, the sacrificial layer 103 and 107 are selectively removed, for example, by wet etching using an alkali solution. Then, a space 103x is formed after removing the sacrificial layer 103, and the slit 105 is reopened.

Figure 7:
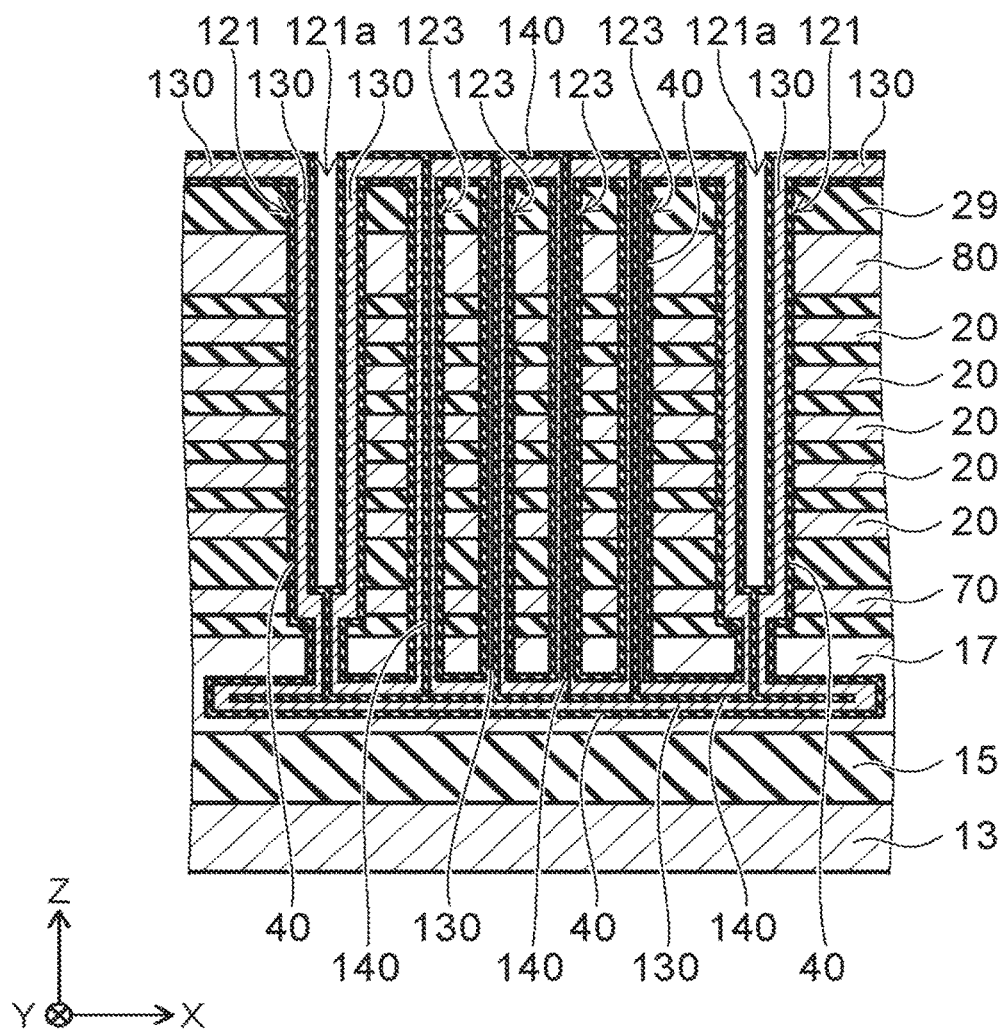

As shown in FIG. 7, the memory film 40, a semiconductor film 130 and a core 140 are formed inside the slits 105 and 121, the memory hole 123, and a space 103x.

For example, the memory film 40 is formed using a low-pressure Chemical Vapor Deposition (CVD) method or an Atomic Layer Deposition (ALD) method so as to cover the inner surfaces of the slits 105 and 121, the memory hole 123, and the space 103x. The memory film 40 has a structure in which a silicon oxide film, a silicon nitride film, and a silicon oxide film are successively stacked, for example.

Then, the semiconductor film 130 is formed on the memory film 40. The semiconductor film 130 is, for example, a poly-silicon film, and is formed using the low-pressure CVD method or the ALD method. Subsequently, the core 140 is formed on the semiconductor film 130. The core 140 is, for example, a silicon oxide film, and is formed by the low-pressure CVD method or the ALD method.

The memory film 40, the semiconductor film 130, and the core 140 are formed to fill the slit 105, the memory hole 123 and the space 130x. In contrast, the memory film 40, the semiconductor film 130, and the core 140 are formed in the slit 121, leaving a space 121a therein. That is, it is possible to make the space 121a in the slit 121 by setting a width $W_2$ of the slit 121 wider than a width $W_1$ of the slit 105 and a diameter $W_3$ of the memory hole 123.

Figure 8:
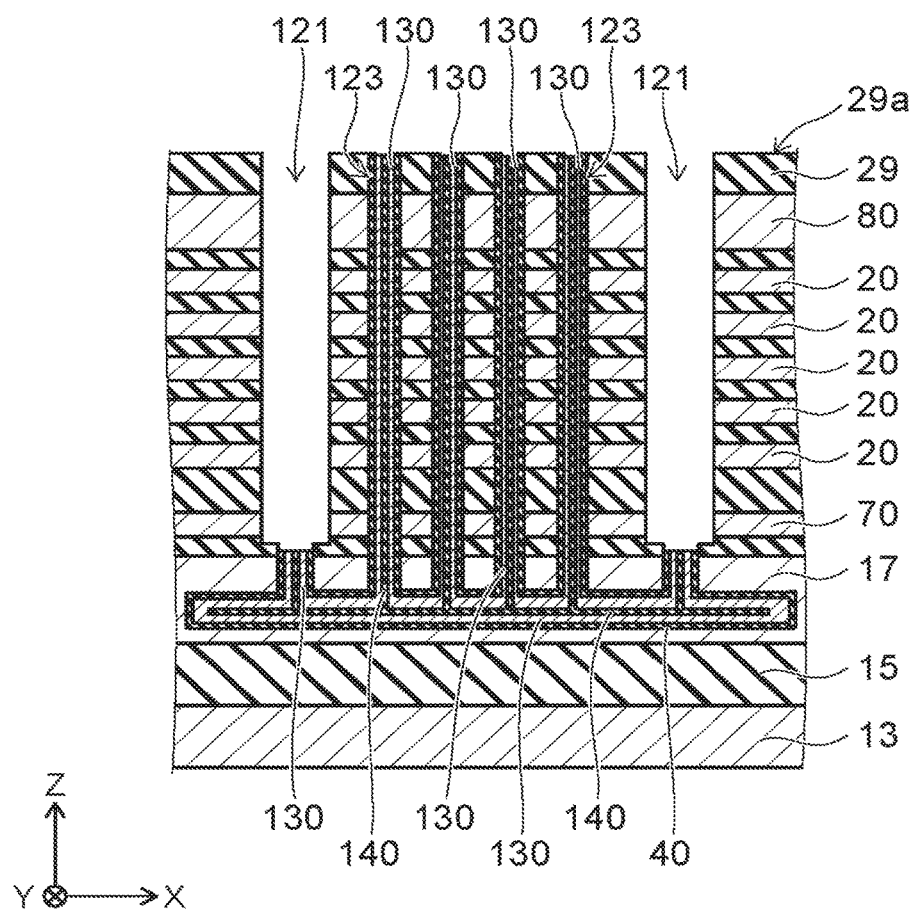

As shown in FIG. 8, by etching the memory film 40, the semiconductor film 130, and the core 140, the portions thereof on the insulation film 29 and in the slit 121 are removed.

The memory film 40, the semiconductor film 130, and the core 140 are preferably etched by using, for example, an isotropic etching method such as a wet etching, a chemical dry etching, or the like. Thus, etching the first portion of the memory film 40, the semiconductor film 130, and the core 140 on the upper surface 29a of the insulation film 29, and etching the second portion thereof in the slit 121 via the space 121a may proceeds from the core 140 to the memory film 40 prior to etching the third portions embedded in the memory holes 123 and the slit 105. Then, it is possible to leave the third portions in the slit 105 and the memory holes 123 by stopping the etchings when the first and second portions are removed.

Figure 9:
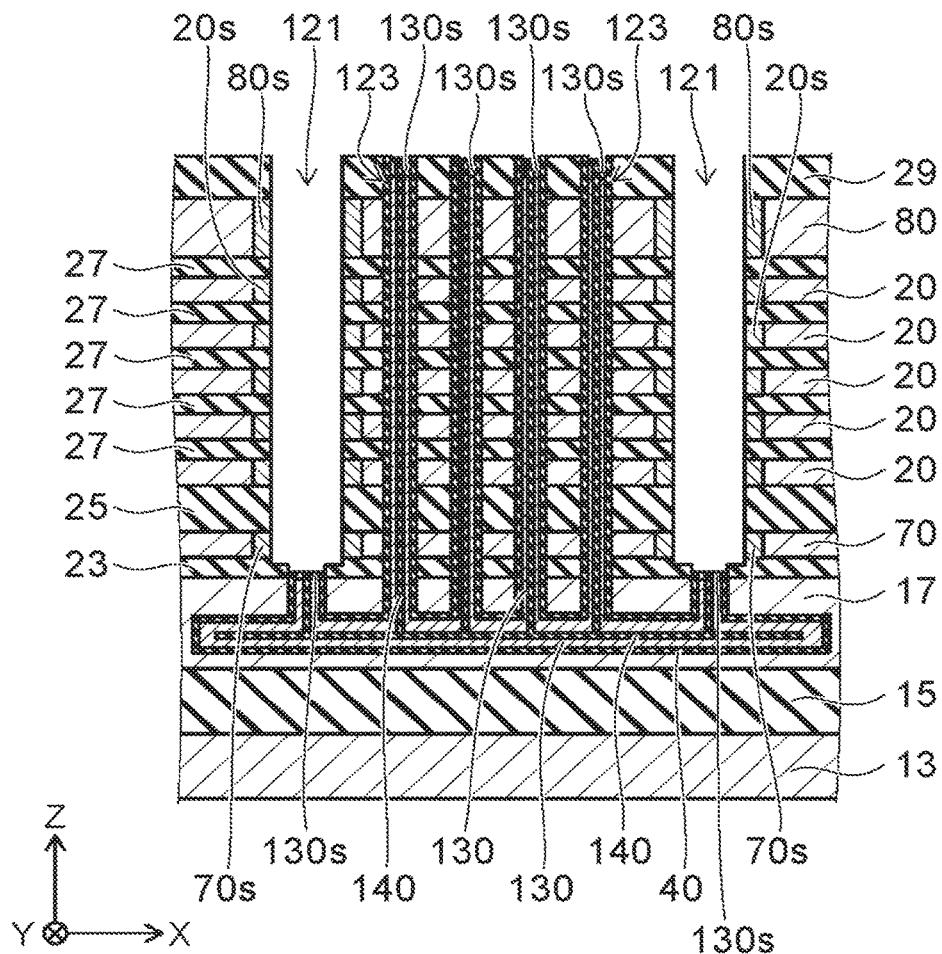

As shown in FIG. 9, each end portion of the control gate 20, and the selection gates 70 and 80, which is exposed in the slit 121, is silicided to reduce resistance thereof.

For example, a nickel film is formed, which covers the insulation film 29 and the inner surface of the slit 121. Subsequently, a heat treatment is performed on the wafer at a predetermined temperature to form a nickel silicide by using reaction of the poly-silicon and the nickel film. Then, parts of nickel film covering the insulation film 23 exposed at the bottom of the slit 121, end surfaces of the insulation films 25 and 27, and the insulation film 29 are removed. Thus, the silicided portions 20s, 70s and 80s are formed at the ends of the control gate 20, the selection gate 70, and the selection gate 80 respectively.

In addition, a silicided portion 130s is formed at an upper end of the semiconductor film 130 embedded in the slit 105 and an upper end of the semiconductor film 130 embedded in the memory hole 123, respectively.

Figure 10:
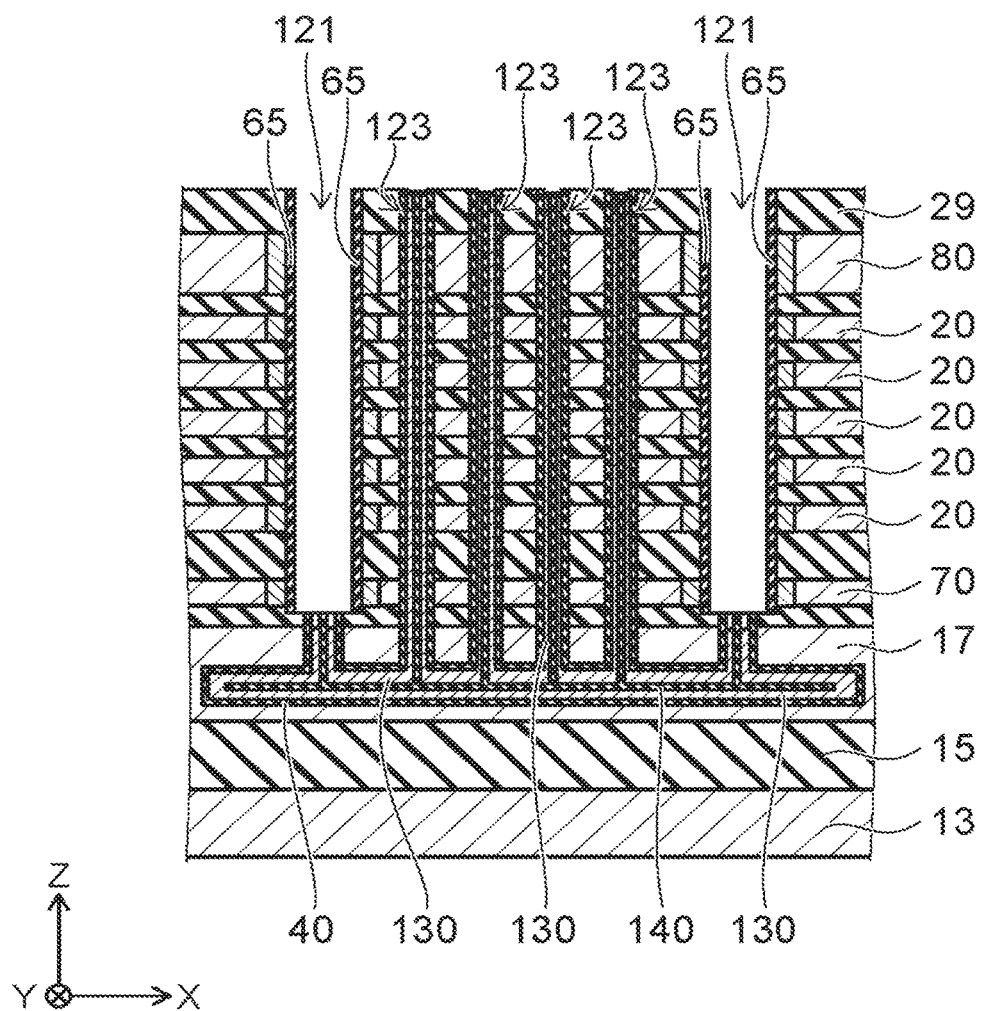

As shown in FIG. 10, an insulation film 65 is formed on an inner wall of the slit 121. The insulation film 65 is, for example, a silicon oxide film formed by using the CVD method. For example, a silicon oxide film is formed to cover the insulation film 29 and an inner surface of the slit 121. Then, for example, parts of the silicon oxide film covering the bottom surface of the slit 121 and an upper surface 29a of the insulation film 29 are removed by using an anisotropic RIE method, leaving a portion of the insulation film 65 on a side wall of the slit 121.

Figure 11:
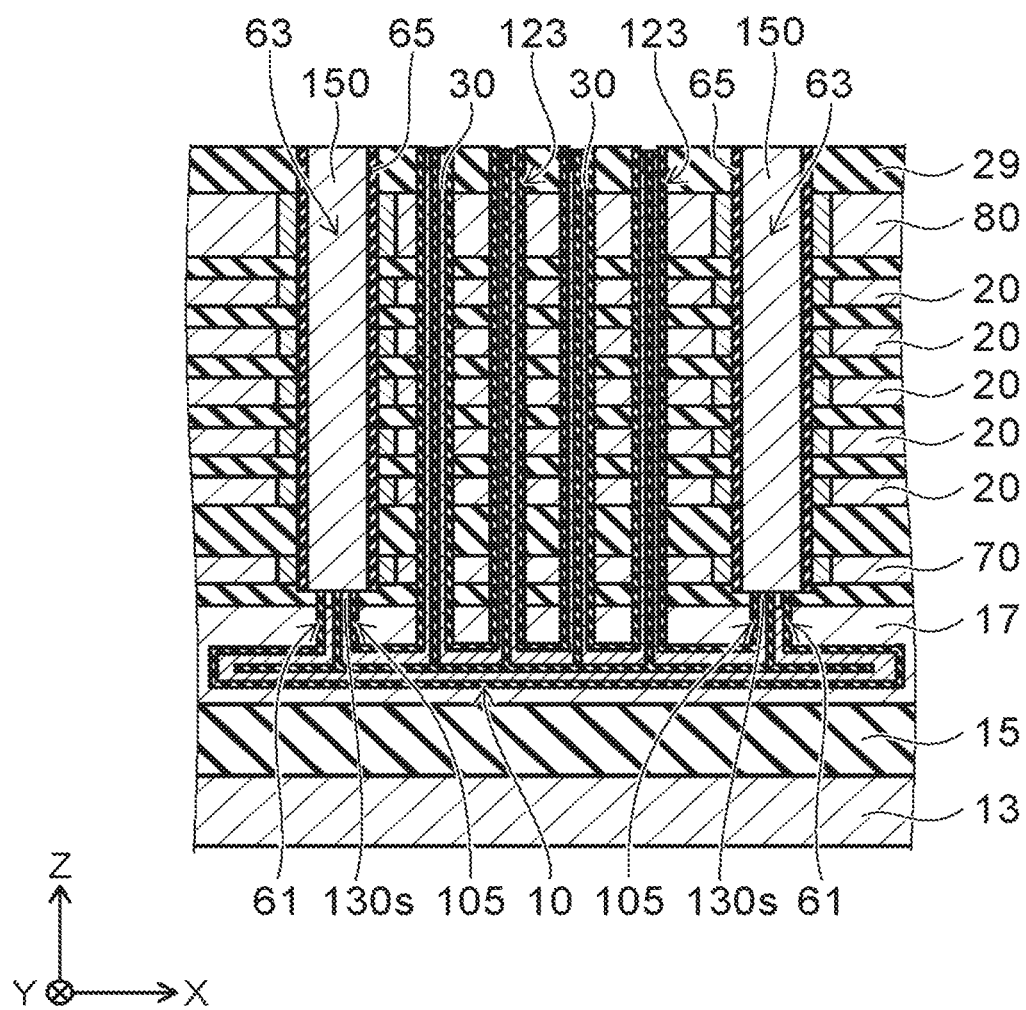

As shown in FIG. 11, a metal film 150 is embedded in the slit 121. The metal film 150 is, for example, a tungsten (W) film formed by using the CVD method. For example, the metal film 150 is formed in a following order. A tungsten film is formed to cover the insulation film 29 and to be embedded in the slit 121. Then, the tungsten film is etched by using a dry etching method to remove a portion provided on the insulation film 29, leaving a portion thereof embedded in the slit 121. Thus, the metal film 150 is formed in the slit 121. In addition, the metal film 150 may have a two-layer structure which includes a barrier metal layer of a titanium nitride (TiN), for example, and tungsten layer, wherein the barrier layer is in contact with the inner surface of the slit 121.

Then, the interconnection layer 50 is formed on the insulation film 29 to complete the non-volatile memory device 1.

The semiconductor film 130 has a first part, a second part and a third part. The first part of the semiconductor film 130 is embedded in the memory hole 123, and serves as the channel body 30. The second part of the semiconductor film 130 is embedded in the space 103x formed by removing the sacrificial layer 103, and serves as the source layer 10. The third part of the semiconductor film 130 is embedded in the slit 105, and serves as a first portion 61 of the conductive body 60. The metal film 150 embedded in the slit 121 is a second portion 63 of the conductive body 60. A silicided portion 130s may be preferably interposed between the first portion 61 and the second portion 63 to reduce a contact resistance therebetween.

In the embodiment, the first portion 61 of the conductive body 60 is in contact with the source layer 10, and enlarges the process margin for removing the memory film 40 as follows. Thus, it may become possible to improve a manufacturing yield by suppressing, for example, an open failure between the source layer 10 and the source line 53 or a short circuit failure between the control gate 20 and the source line 53.

In the process step shown in FIG. 8, the first portion 61 is formed by etching the memory film 40, the semiconductor film 130, and the core 140. In this step, the first portion 61 is formed with variation in the upper end position thereof due to unevenness of an etching amount, and such a variation may reduce the process margin. For example, an upper end of the first portion 61 is set downward by over-etching the semiconductor film 130. Further, while removing the memory film 40 that covers an inner surface of the slit 121, the insulation film 23 may also be etched, and an upper surface of the insulation film 23 is set downward between the back gate layer 17 and the selection gate 70, facilitating the over-etching of the semiconductor film 130. As a result, the upper end position of the first portion 61 is varied depending on the etching condition.

The upper end of the first portion 61 is preferably positioned at a level between the back gate layer 17 and the selection gate 70 in the Z-direction, for example. Thus, a thickness of the insulation film 23 in the Z-direction may be set to absorb the variation width of the upper end position of the first portion 61. Thereby, it becomes possible to enlarge the process margin for etching the memory film 40, the semiconductor film 130 and the core 140.

Then, a method of manufacturing the non-volatile memory device 1 according to a variation of the first embodiment will be described referring to FIGS. 12 to 16. FIGS. 12 to 16 are a schematic cross-sectional views which show another method for manufacturing the non-volatile memory device 1.

Figure 12:
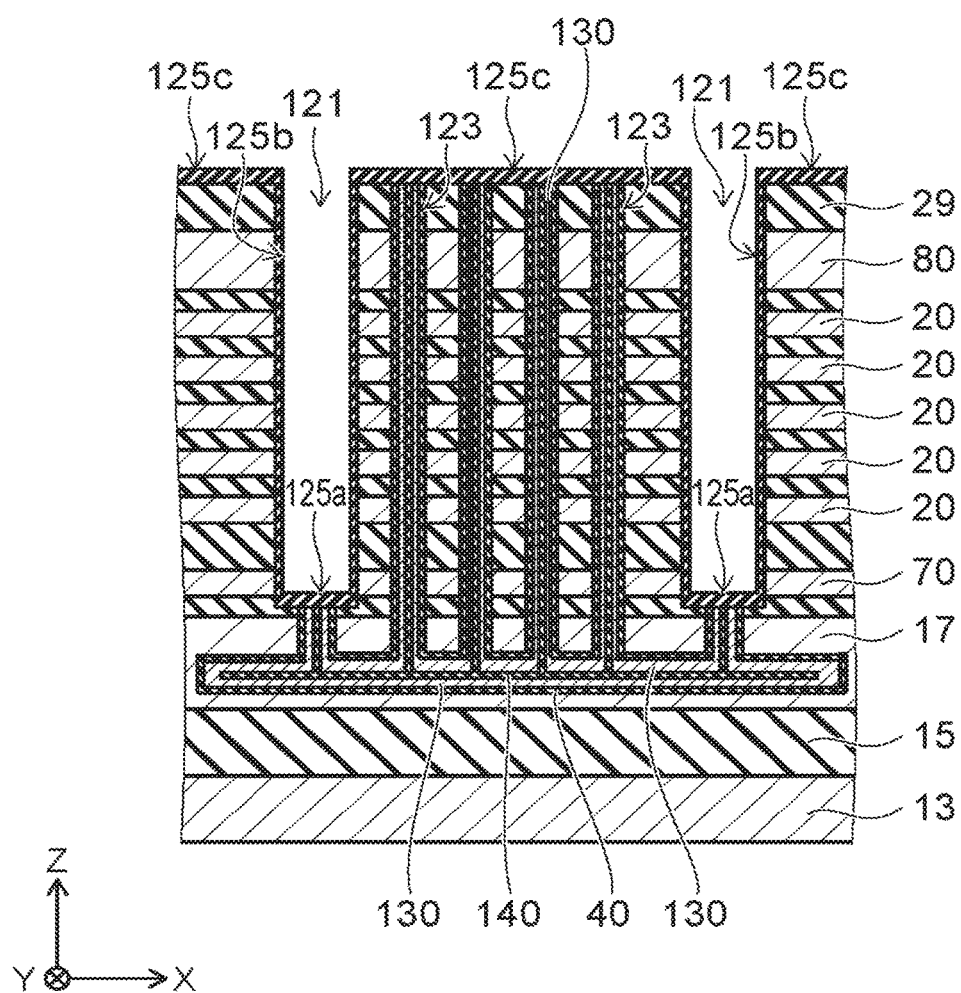
FIGS. 12 to 16 are schematic cross-sectional views showing a manufacturing process of a non-volatile memory device according to a variation of the first embodiment.

For example, after etching the memory film 40, the semiconductor film 130, and the core 140 as shown in FIG. 8, an insulation film 125 is formed to cover the inner surface of the slit 121 and the insulation film 29 as shown in FIG. 12.

The insulation film 125 is, for example, a silicon oxide film formed using a plasma CVD method. For example, by using the plasma CVD method, it becomes possible to form the insulation film 125 that has a portion 125a on the bottom surface of the slit 121, a portion 125b on the inner wall of the slit 121 and a portion 125c on the insulation film 29, wherein the portions 125a and 125c are thicker than the portion 125b.

Figure 13:
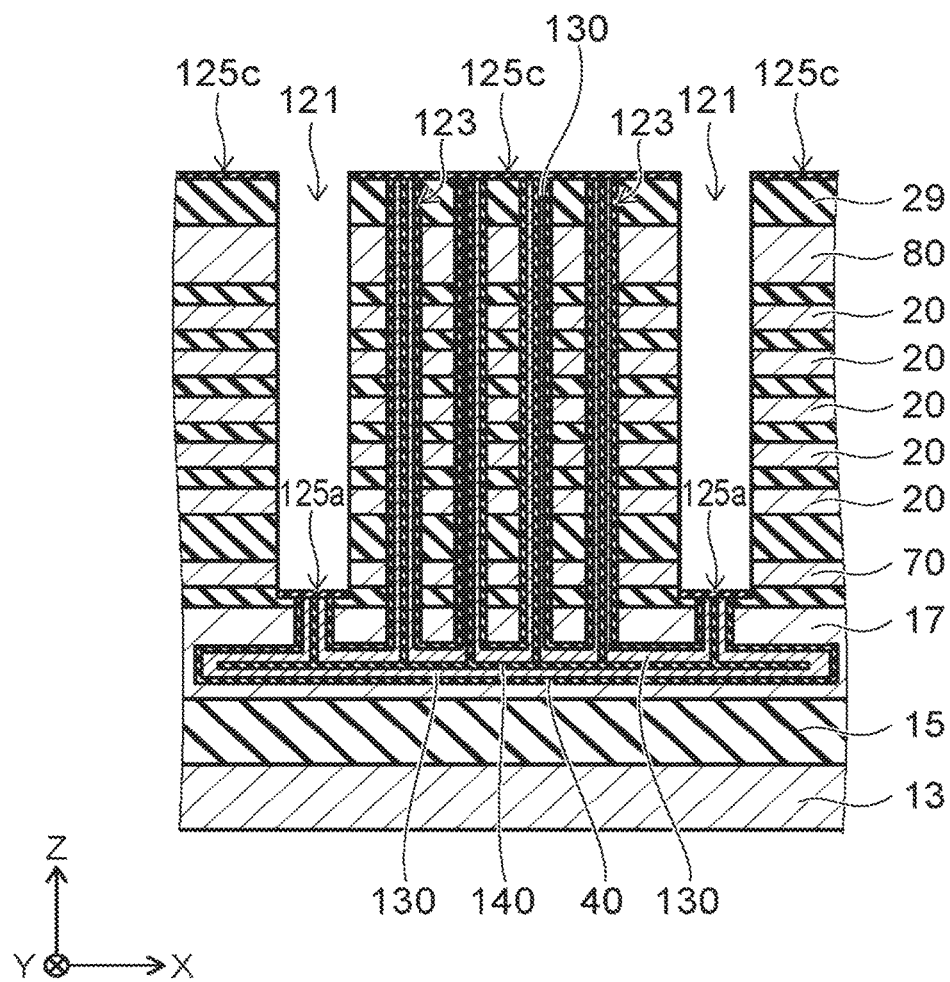

As shown in FIG. 13, the insulation film 125 is etched until the inner wall of the slit 121 is exposed. By using an isotropic etching method, such as a Chemical Dry Etching (CDE) method, the portion 125b formed on the inner wall of the slit 121 is removed. Since the portion 125a and the portion 125c are thicker than the portion 125b, it may be possible to leave the portion 125a on the bottom surface of the slit 121 and the portion 125c on the insulation film 29.

Figure 14:
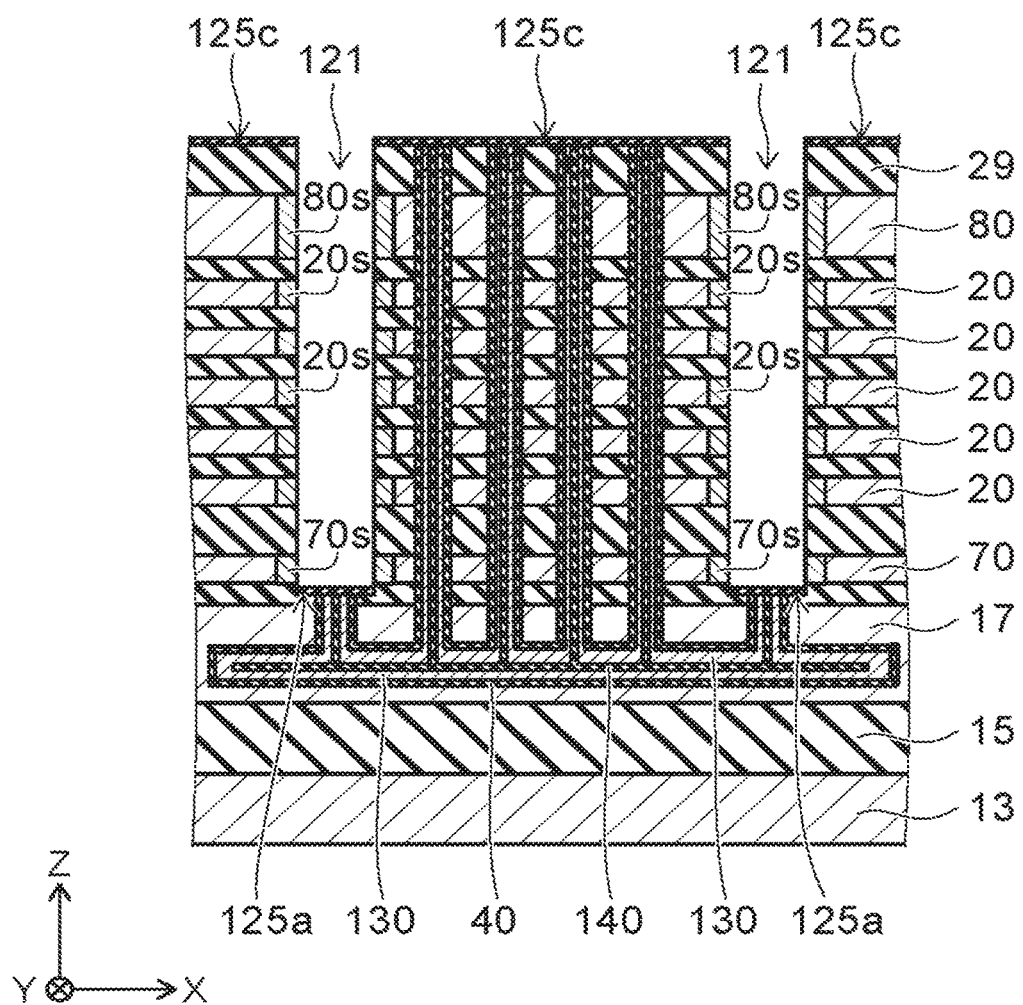

As shown in FIG. 14, each end portion of the control gate 20, the selection gates 70 and 80, which is exposed in the slit 121, is silicided to reduce the resistance of the control gate 20, and the selection gates 70 and 80.

For example, the silicided portions 20s, 70s and 80s are formed respectively in the end portions of the control gate 20, the selection gate 70, and the selection gate 80 by forming a nickel film covering the inner surface of the slit 121 and performing heat treatment thereon.

Figure 15:
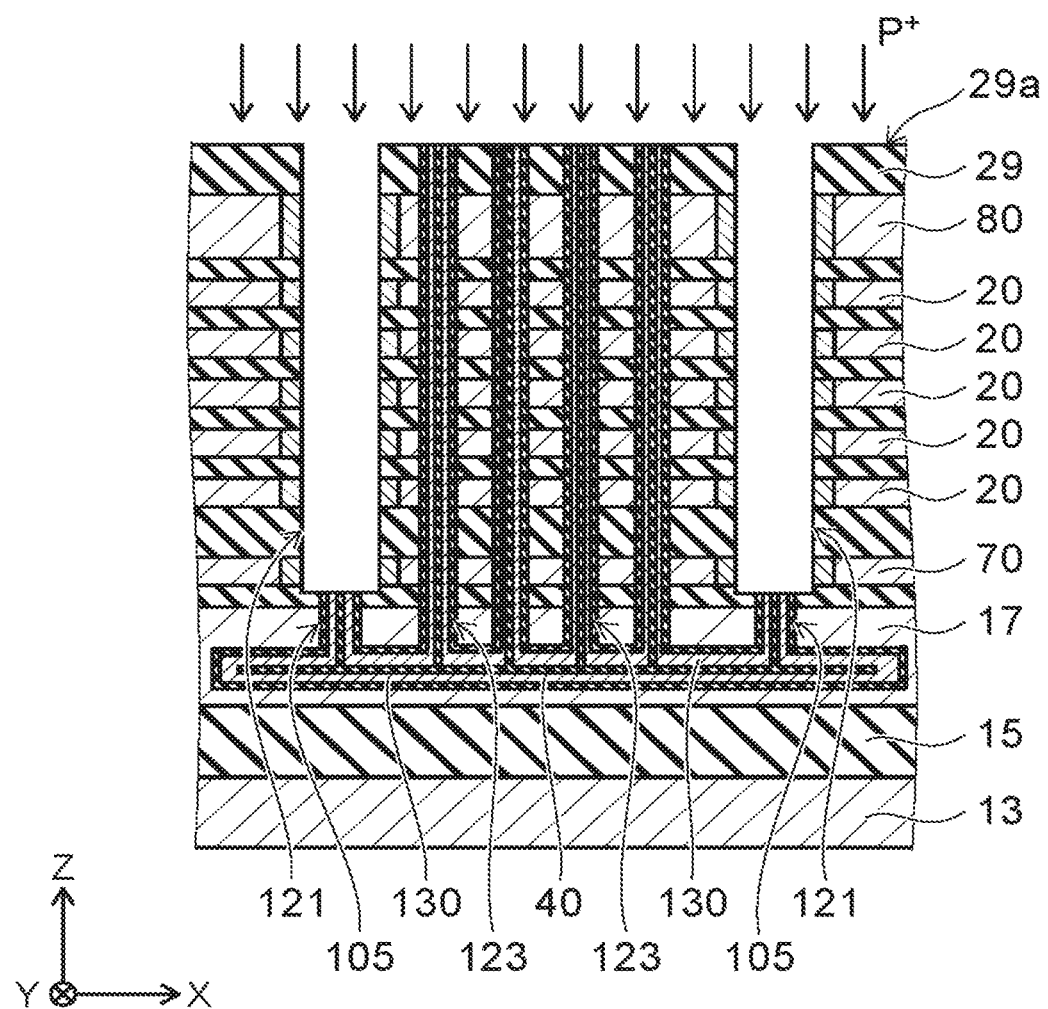

As shown in FIG. 15, the insulation film 125 is removed. Subsequently, for example, an N-type impurity is ion-implanted into the exposed portions of the semiconductor film 130 at the bottom of the slit 121 and in the upper surface 29a of the insulation film 29. A vapor-phase doping of an N-type impurity may be performed instead of the ion-implantation. A phosphorus (P) may be used as the N-type impurity, for example.

Figure 16:
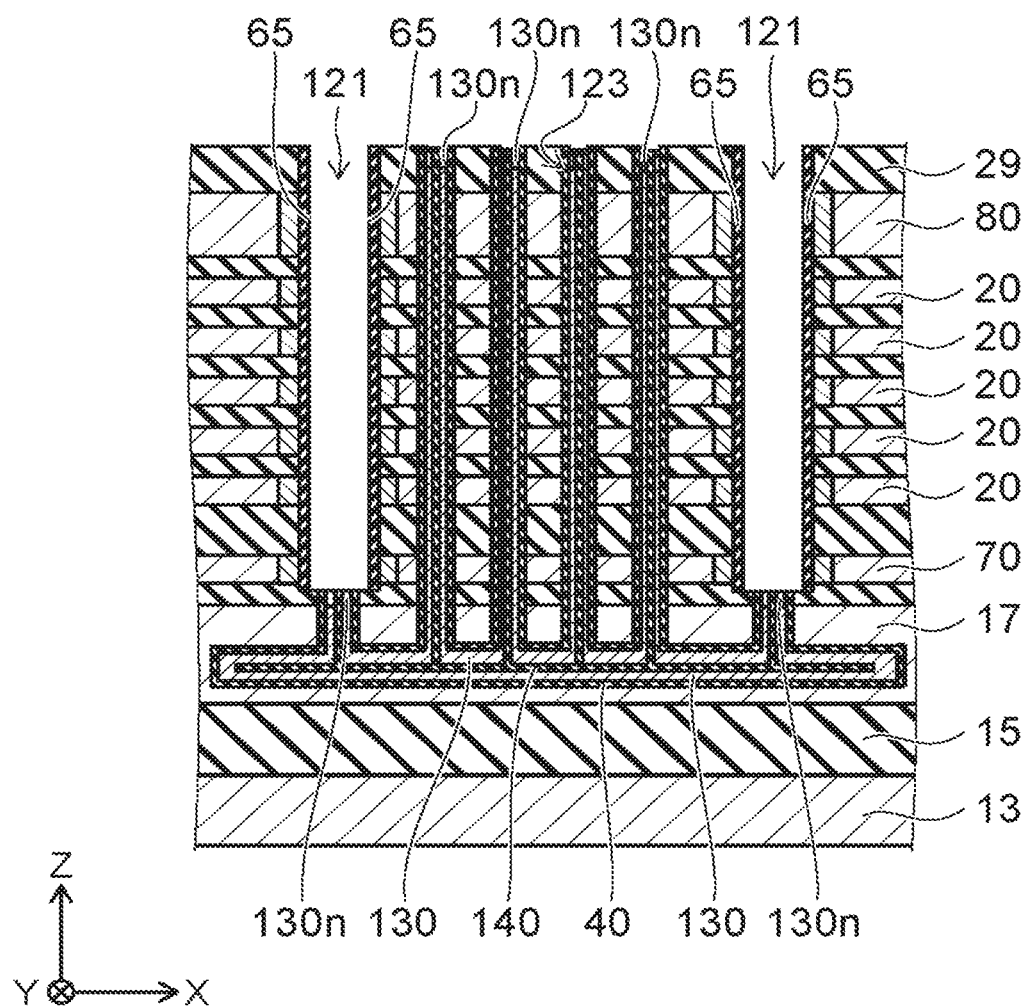

As shown in FIG. 16, the insulation film 65 is formed on the inner wall of the slit 121. For example, a silicon oxide film is formed to cover the insulation film 29 and the inner surface of the slit 121. Then, the silicon oxide film formed on the bottom surface of the slit 121 and the upper surface 29a of the insulation film 29 is removed by using, for example, an anisotropic RIE method, leaving a part of the silicon oxide film as the insulation film 65 on the inner wall of the slit 121.

Subsequently, as shown in FIG. 11, a metal film is embedded in the slit 121, and the interconnection layer 50 is formed on the insulation film 29 to complete the non-volatile memory device 1.

In this example, the insulation film 125 is formed on the bottom surface of the slit 121 and the upper surface 29a of the insulation film 29 to prevent an upper end of the semiconductor film 130 embedded in the slit 105 and an upper end of the semiconductor film 130 embedded in the memory hole 123 from being silicided. Then, a diffusion region 130n doped with the N-type impurity is formed at each end of the semiconductor film 130. For example, by optimizing a concentration and a profile of the N-type impurity in the diffusion region 130n, it becomes possible to improve data erase characteristics of a NAND string that is provided in the memory hole 123.

Second Embodiment

A method of manufacturing the non-volatile memory device 1 according to a second embodiment will be described referring to FIGS. 17 to 21. FIGS. 17 to 21 are schematic cross-sectional views which represent the other manufacturing process of the non-volatile memory device 1.

Figure 17:
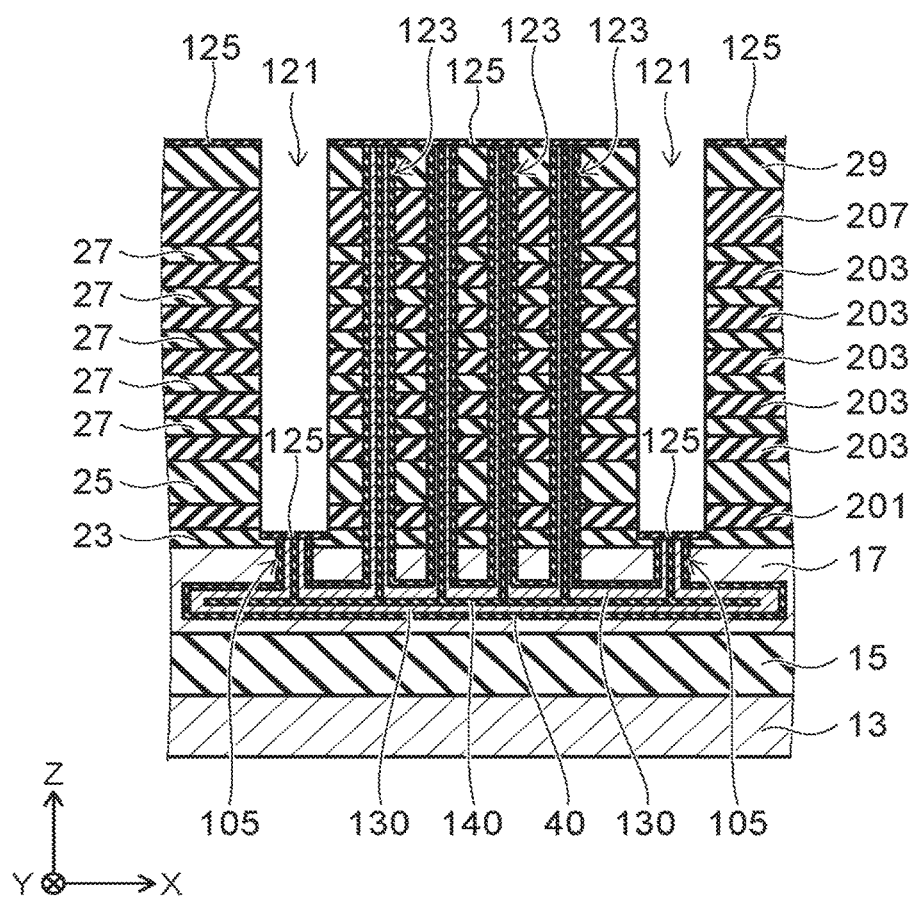
FIGS. 17 to 21 are schematic cross-sectional views showing a manufacturing process of a non-volatile memory device according to a second embodiment.

As shown in FIG. 17, the insulation film 125 is formed on the bottom surface of the slit 121 and on the insulation film 29. In this example, sacrificial films 201, 203, and 207 are formed in place of the control gate 20, the selection gates 70 and 80 shown in FIG. 13. The sacrificial film 201, 203, and 207 are, for example, a silicon nitride film. That is, a silicon oxide film and a silicon nitride film are alternately stacked on the back gate layer 17.

Figure 18:
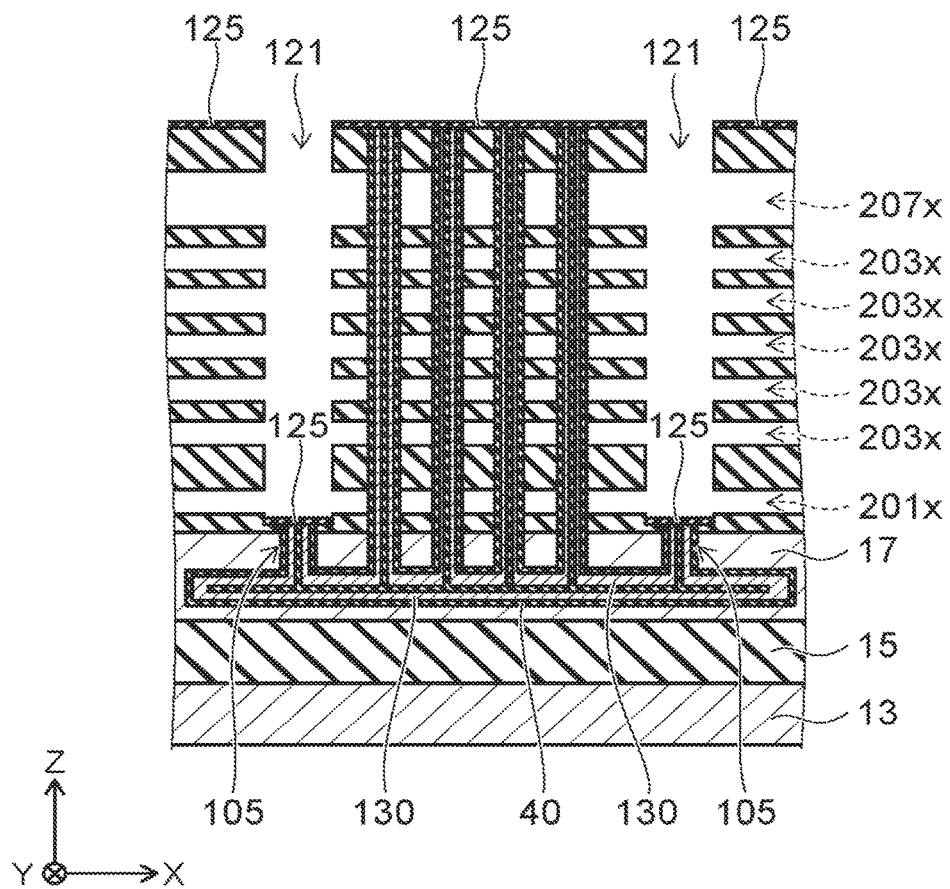

As shown in FIG. 18, the sacrificial films 201, 203, and 207 are selectively removed. For example, the sacrificial films 201, 203, and 207 are removed by a wet etching, for example, via the slit 121. For example, it is possible to selectively remove the silicon nitride film using a hot phosphoric acid as an etching solution without etching the silicon oxide film.

Figure 19:
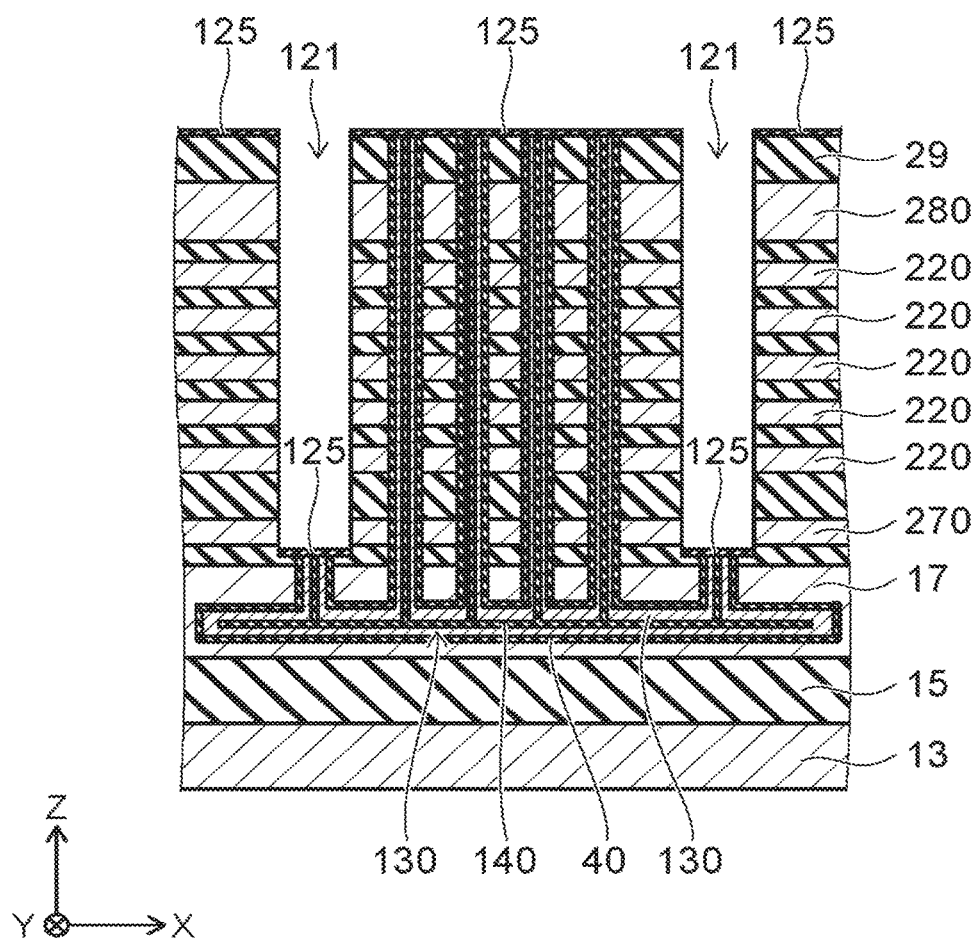

As shown in FIG. 19, a control gates 220, selection gates 270 and 280 are formed in spaces 201x, 203x, and 207x formed by removing the sacrificial films 201, 203, and 207. The control gates 220, the selection gates 270 and 280 are a metal film, for example.

For example, a tungsten film is formed in the spaces 201x, 203x, and 207x via the slit 121. The tungsten film is formed by using the CVD method, for example. In addition, the control gates 220 and the selection gates 270 and 280 may have a two-layer structure which includes, for example, a titanium nitride (TiN) and tungsten.

Figure 20:
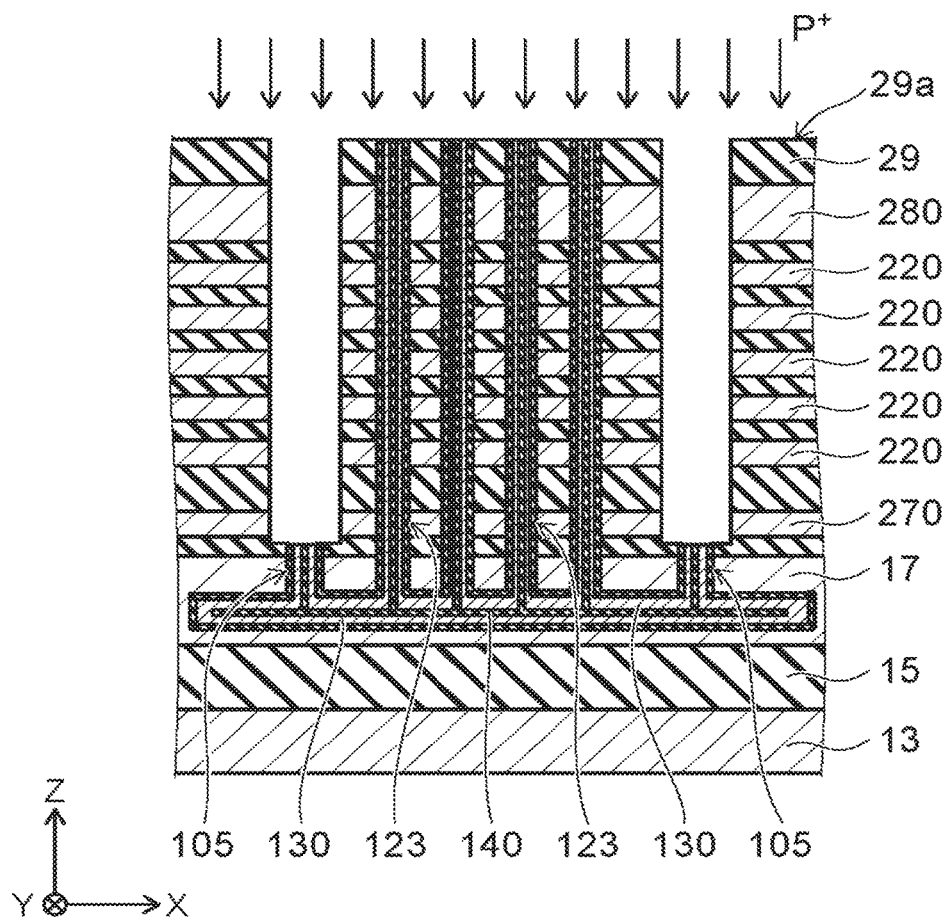

As shown in FIG. 20, the insulation film 125 is removed. Then, the N-type impurity, for example, is ion-implanted into the exposed portions of the semiconductor film 130 in the bottom portion of the slit 121 and in the upper surface 29a of the insulation film 29. Instead of the ion-implantation, the vapor-phase doping of the N-type impurity may be performed.

Figure 21:
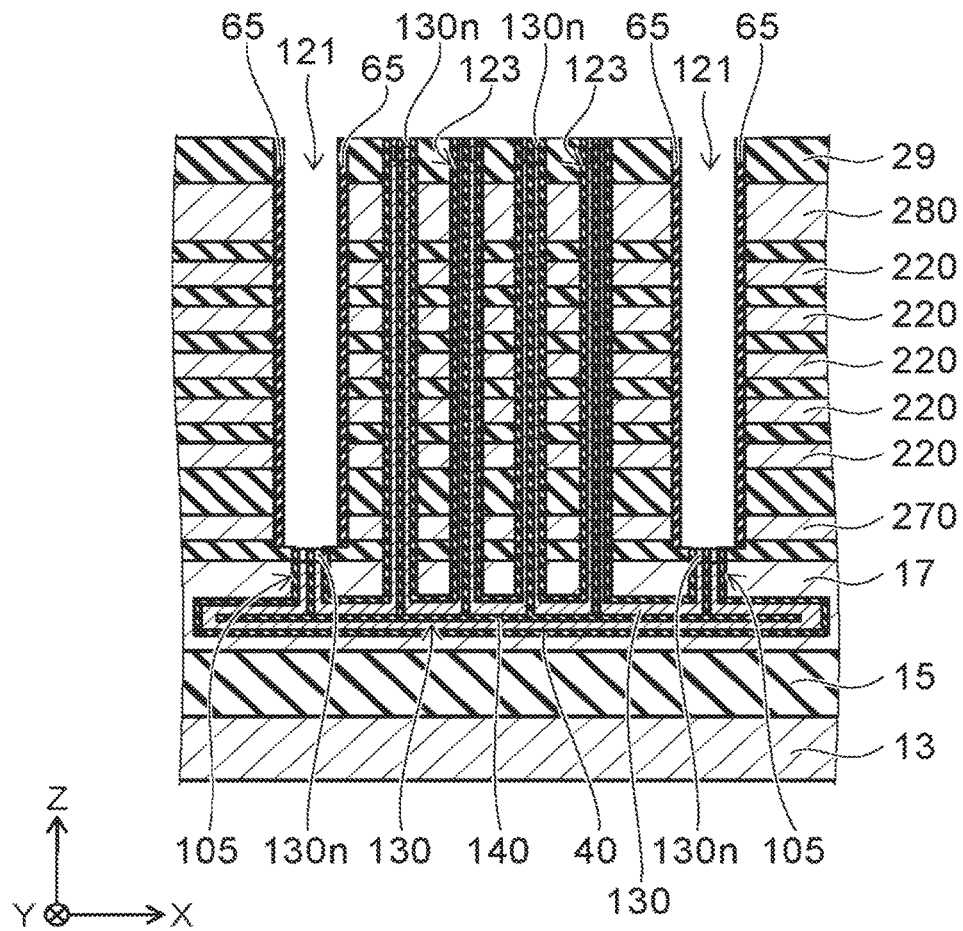

As shown in FIG. 21, the insulation film 65 is formed on the inner wall of the slit 121. Subsequently, a metal film is embedded in the slit 121 through the process shown in FIG. 11. Furthermore, the interconnection layer 50 is formed on the insulation film 29 to complete the non-volatile memory device 1.

In this example, the metal film is used as the control gates 220 and the selection gates 270 and 280. Accordingly, the electric resistance of the control gate 220 and the selection gates 270 and 280 is reduced, and an operation speed of the memory cell MC is improved. In addition, the diffusion region 130n doped with the N-type impurity is formed at the upper end of the semiconductor film 130 embedded in the slit 105 and the upper end of the semiconductor film 130 embedded in the memory hole 123, thereby improving the erase characteristics of the NAND string.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
   a substrate;
   an insulation film provided above the substrate;
   a first conductive layer provided above the insulation film;
   an upper interconnect structure including a first interconnection and a second interconnection;
   electrodes provided between the first conductive layer and the upper interconnect structure, the electrodes being arranged in a first direction perpendicular to the first conductive layer and functioning as control gates for memory cells;
   semiconductor bodies extending through the electrodes in the first direction, one end of one of the semiconductor bodies being electrically connected to the first conductive layer, and the other end of the one of the semiconductor bodies being electrically connected to the first interconnection; and
   a conductive body extending in the first direction between the first conductive layer and the second interconnection, the conductive body electrically connecting the first conductive layer and the second interconnection, and including a first portion and a second portion provided between the first portion and the second interconnection,
   the first portion being connected to the first conductive layer, and the second portion being electrically connected to the second interconnection and having a width in a second direction orthogonal to the first direction that is wider than a width of the first portion in the second direction, and
   a number of the semiconductor bodies being more than a number of the conductive body.

2. The device according to claim 1,
   wherein the second portion includes a metal film.

3. The device according to claim 2,
   wherein the metal film contains tungsten.

4. The device according to claim 1,
   wherein the one of the semiconductor bodies has a circular shape cross section perpendicular to the first direction.

5. The device according to claim 4,
   wherein a diameter of the one of the semiconductor bodies having the circular shape cross section is smaller than the width of the second portion in the second direction at a same level in the first direction.

6. The device according to claim 1, further comprising an insulating core provided inside the semiconductor bodies.

7. The device according to claim 1,
   wherein each of the electrodes extends in a third direction orthogonal to the first direction and the second direction.

8. The device according to claim 7,
   wherein the second interconnection extends in the third direction; and the first interconnection extends in the second direction.

9. The device according to claim 1,
   wherein each of the electrodes is a polycrystalline silicon film or a metal film.

10. The device according to claim 1,
    wherein the first conductive layer functions as a source layer.

11. The device according to claim 1,
    wherein the first conductive layer includes a polycrystalline silicon film.

12. A non-volatile memory device comprising:
    a substrate;
    an insulation film provided above the substrate;
    a first conductive layer provided above the insulation film;
    an upper interconnect structure including a first interconnection and a second interconnection;
    electrodes provided between the first conductive layer and the upper interconnect structure, the electrodes being arranged in a first direction perpendicular to the first conductive layer and functioning as control gates for memory cells;
    at least one semiconductor body extending through the electrodes in the first direction, one end of the semiconductor body being electrically connected to the first conductive layer, and the other end of the semiconductor body being electrically connected to the first interconnection; and a conductive body extending in the first direction between the first conductive layer and the second interconnection and electrically connecting the first conductive layer and the second interconnection via a lower part and an upper part of the conductive body, the upper part containing a metal and having a width in a second direction orthogonal to the first direction that is wider than a width of the lower part in the second direction, the lower part being connected to the first conductive layer, and the upper part including a metal portion positioned at a same level in the first direction as at least one of the electrodes.

13. The device according to claim 12,
wherein the upper part contains tungsten as the metal.

14. The device according to claim 12,
wherein the lower part has a length in the first direction shorter than an interval between the first conductive layer and one of the electrodes closest to the first conductive layer among the electrodes.

15. The device according to claim 12, further comprising an insulating core provided inside the semiconductor body.

16. The device according to claim 12,
wherein each of the electrodes extends in a third direction orthogonal to the first direction and the second direction.

17. The device according to claim 16,
wherein the second interconnection extends in the third direction; and the first interconnection extends in the second direction.

18. The device according to claim 12,
wherein each of the electrodes is a polycrystalline silicon film or a metal film.

19. The device according to claim 12,
wherein the first conductive layer functions as a source layer.

20. The device according to claim 12,
wherein the first conductive layer includes a polycrystalline silicon film.

* * * * *